United States Patent
Yasuda et al.

(10) Patent No.: US 9,728,442 B2
(45) Date of Patent: Aug. 8, 2017

(54) WORKPIECE HOLDING APPARATUS

(71) Applicant: SHIN-ETSU HANDOTAI CO., LTD., Tokyo (JP)

(72) Inventors: Taichi Yasuda, Kita-ku (JP); Tatsuo Enomoto, Setagaya-ku (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/122,524

(22) PCT Filed: Feb. 17, 2015

(86) PCT No.: PCT/JP2015/000703
§ 371 (c)(1),
(2) Date: Aug. 30, 2016

(87) PCT Pub. No.: WO2015/141122
PCT Pub. Date: Sep. 24, 2015

(65) Prior Publication Data
US 2017/0069523 A1   Mar. 9, 2017

(30) Foreign Application Priority Data
Mar. 19, 2014  (JP) ................................. 2014-056852

(51) Int. Cl.
*B25J 15/06*  (2006.01)
*H01L 21/683*  (2006.01)
(Continued)

(52) U.S. Cl.
CPC .......... *H01L 21/6838* (2013.01); *B24B 41/06* (2013.01); *B25J 15/0658* (2013.01);
(Continued)

(58) Field of Classification Search
CPC .. B25J 15/065; B25J 15/0658; B25J 15/0666; B25J 15/0683; B25J 11/0095;
(Continued)

(56) References Cited

U.S. PATENT DOCUMENTS 3,602,543 A * 8/1971 Sjodin ................... B66C 1/0212
248/363
4,221,356 A * 9/1980 Fortune ................. B25B 11/005
248/363
(Continued)

FOREIGN PATENT DOCUMENTS

| CN | 202643070 U | 1/2013 |
| JP | 2001-029388 A | 2/2001 |

(Continued)

OTHER PUBLICATIONS

May 26, 2015 Search Report issued in International Patent Application No. PCT/JP2015/000703.
(Continued)

*Primary Examiner* — Dean Kramer
(74) *Attorney, Agent, or Firm* — Oliff PLC

(57) ABSTRACT

A workpiece holding apparatus, including: a rigid body having a vent; a suction pad adhered onto the lower end face of rigid body and having an opening communicating with vent, being configured to suck and hold a workpiece; an air controlling mechanism communicating with the vent, being configured to aspirate or discharge air through vent to aspirate or discharge air from opening; and a swelling portion being configured to be supplied with air by air controlling mechanism through the vent to swell out at least part of an area of suction pad to be in contact with the workpiece toward the workpiece in detaching workpiece from suction pad; wherein suction pad is configured to suck and hold workpiece by bringing the opening into contact with workpiece while aspirating air by air controlling (Continued)

mechanism through opening, and is configured to detach the workpiece from suction pad by discharging air from opening.

2 Claims, 5 Drawing Sheets

(51) Int. Cl.
*B24B 41/06* (2012.01)
*H01L 21/304* (2006.01)

(52) U.S. Cl.
CPC ....... *B25J 15/0666* (2013.01); *B25J 15/0683* (2013.01); *H01L 21/304* (2013.01)

(58) Field of Classification Search
CPC .. H01L 21/6838; H01L 21/304; Y10S 901/40; B24B 41/06
USPC .................................................. 294/183, 187
See application file for complete search history.

(56) References Cited

U.S. PATENT DOCUMENTS

| | | | |
|---|---|---|---|
| 4,294,424 A * | 10/1981 | Teissier | B25B 11/007 248/205.9 |
| 4,620,738 A * | 11/1986 | Schwartz | B65G 47/91 271/90 |
| 4,669,915 A | 6/1987 | Shatto, Jr. | |
| 5,423,716 A * | 6/1995 | Strasbaugh | B23B 31/307 269/21 |
| 5,772,170 A * | 6/1998 | Tsukushi | B25B 11/005 248/205.9 |
| 6,135,858 A * | 10/2000 | Takahashi | B24B 37/30 451/288 |
| 7,086,675 B2 * | 8/2006 | Jacobs | B65G 47/90 294/183 |
| 7,445,543 B2 * | 11/2008 | Torii | B24B 37/345 451/289 |
| 7,909,374 B2 * | 3/2011 | Thallner | H01L 21/6838 294/212 |
| 2012/0193500 A1 * | 8/2012 | Kniss | B25B 11/007 248/363 |

FOREIGN PATENT DOCUMENTS

| | | |
|---|---|---|
| JP | 2005-123485 A | 5/2005 |
| JP | 2012-204709 A | 10/2012 |
| WO | 2005/037488 A1 | 4/2005 |

OTHER PUBLICATIONS

Aug. 16, 2016 Office Action Issued in Japanese Patent Application No. 2014-056852.
Sep. 20, 2016 International Preliminary Report on Patentability issued in International Patent Application No. PCT/JP2015/000703.
Dec. 12, 2016 Office Action issued in Taiwanese Patent Application No. 104105975.

\* cited by examiner (1) Suction pad swells out
(2) Motion of liquid (reduction of area A)
(3) Increase of liquid thickness h

WORKPIECE HOLDING APPARATUS

TECHNICAL FIELD

The present invention relates to an apparatus for holding a workpiece when transporting a workpiece such as a silicon wafer.

BACKGROUND ART

For in-process transportation of a wafer in a processing step of a thin plate-form workpiece such as a silicon wafer, for example, it is usual to use a box or a cassette having plural of slots to store one wafer per each. The transported box or cassette is set to a processing apparatus in a step at the destination, and the wafers are taken out therefrom and are set to the processing apparatus. The wafers subjected to the processing are stored to a box or a cassette again, and transported to the next step.

On this occasion, the transportation of wafers, in which wafers are taken out from a box or a cassette, set to a processing apparatus, and stored to a box or a cassette, are performed automatically by a robot or an actuator, etc. without handwork in many cases.

In such transportation of wafers, wafers are held by a hand attached to a robot or an actuator (hereinafter, also referred to as a workpiece holding apparatus), transported to the destination, and released thereto (see Patent Document 1). In this case, it is usual to adopt a method such as aspirating suction, an edge grip, a Bernoulli chuck for holding the wafers.

Herein, a workpiece holding apparatus using aspirating suction will be described with referring to FIGS. 10 (*a*) and (*b*).

The workpiece holding apparatus 101 is provided with an air controlling mechanism 106 and a vent 103. This is configured to aspirate air in suction of a workpiece W, and is configured to stop this aspiration when separating (detaching) the workpiece W or to supply air in order to enhance the separation.

In the workpiece holding apparatus 101 using this aspirating suction, the workpiece holding portion is usually pasted with a suction pad 104 having elasticity. This suction pad 104 sucks the workpiece W by aspirating air through an opening 105. In this case, it is possible to enhance the aspiration effect by increasing the adhesiveness between the workpiece W and the holding portion by the suction pad 104. It is also possible to prevent an occurrence of a defect on a workpiece due to direct contact between the main body 102 of the holding apparatus and a workpiece W.

CITATION LIST

Patent Literature

Patent Document 1: Japanese Unexamined Patent publication (Kokai) No. 2001-29388

SUMMARY OF INVENTION

Technical Problem

By the way, processing steps of a wafer uses liquid such as water, slurry, and a liquid reagent. Accordingly, transportation of a wafer is often performed in a state in which the wafer is wetting.

The previous workpiece holding apparatus can have a problem in which a wafer cannot be smoothly detached at the destination when the wafer is wetting as described above.

In the case that a wafer is wetting, liquid intervenes between a suction pad and the wafer when the wafer is aspirated and held to a holding apparatus. Although a wafer is sucked to a workpiece holding apparatus mainly by vacuum, this intervening liquid also generates adsorption force between the suction pad and the wafer. Accordingly, the adsorption force caused by the liquid remains even after stopping the vacuum, although the adsorption force caused by the vacuum is disappeared, thereby causing a problem in which the wafer is not separated from the workpiece holding apparatus.

By blowing air through an opening of the suction pad, it is possible to partly remove the liquid, however, it is difficult to spread air on all over the suction surface, and accordingly the liquid remains, thereby remaining adsorption force due to liquid.

When the reliability of wafer separation is lowered as described above, it is impossible to accurately place the wafer onto an intended position in a wafer handling apparatus. Furthermore, a wafer is adhered onto a suction pad by the adsorption force of the liquid even when the wafer is intended to be detached by stopping the vacuum, and accordingly, it happens that the wafer is brought to an unintended place or the wafer falls on the way to break the wafer or the apparatus. This causes a problem of lowering the yield or lowering the machine productivity caused by restoration work of the apparatus.

The present invention was accomplished in view of the above-described problems. It is an object of the present invention to provide a workpiece holding apparatus which can securely detach a workpiece by lowering adsorption force between the workpiece and a suction pad when the work held by the suction pad is detached from the suction pad.

Solution to Problem

To solve the problems, the present invention provides a workpiece holding apparatus, comprising: a rigid body having a vent; a suction pad adhered onto the lower end face of the rigid body and having an opening communicating with the vent, being configured to suck and hold a workpiece; an air controlling mechanism communicating with the vent, being configured to aspirate or discharge air through the vent to aspirate or discharge air from the opening; and a swelling portion being configured to be supplied with air by the air controlling mechanism through the vent to swell out at least a part of an area of the suction pad to be in contact with the workpiece toward the workpiece in detaching the workpiece from the suction pad; wherein the suction pad is configured to suck and hold the workpiece by bringing the opening into contact with the workpiece while aspirating air by the air controlling mechanism to aspirate air through the opening, and is configured to detach the workpiece from the suction pad by discharging air from the air controlling mechanism to discharge air through the opening.

In detaching (separating) a workpiece from a suction pad as described above, by swelling an area of the suction pad to be in contact with the workpiece, it is possible to largely lower the adsorption force even when liquid intervenes between the workpiece and the suction pad to generate adsorption force due to the liquid. Accordingly, it is possible to securely detach the workpiece from the suction pad.

The swelling portion can be composed of a concave part formed on a lower end portion of the rigid body, the suction pad, and a space defined by the both; and the space can be configured to be supplied with air and pressurized by the air controlling mechanism to swell out the suction pad toward the workpiece.

Such constitution makes it possible to swell the suction pad with a simple structure, and accordingly to detach a workpiece from the suction pad more easily.

In this case, it is preferred that the swelling portion is provided with a pressurizing member in the space thereof, the pressurizing member being configured to be pressurized by air discharged from the air controlling mechanism to pressurize the suction pad to swell out the suction pad.

When the pressurizing member is contained in the space as described above, the suction pad can be securely swelled out by the pressurizing member, and accordingly the workpiece can be securely detached from the suction pad.

In this case, the swelling portion can be located at a position other than the opening in the area of the suction pad to be in contact with the workpiece.

In the present invention, the swelling portion can be located at a position other than the opening of the suction pad, which can simplify the structure of the holding apparatus and can suppress the production cost thereby.

Advantageous Effects of Invention

The inventive workpiece holding apparatus makes it possible to lower the adsorption force when detaching a workpiece from the suction pad and to detach the workpiece from the suction pad securely. As a result, in transportation of a workpiece, it comes to be possible to securely transport the workpiece to an intended place, and to prevent a breakage of the wafer or the apparatus due to unintended falling of the wafer, and accordingly it is possible to prevent lowering of the yield and lowering of the machine productivity.

DESCRIPTION OF EMBODIMENTS

Hereinafter, the embodiments of the present invention will be described, but the present invention is not limited thereto.

As described above, when the surface of a workpiece to be held is wetting, there have been a problem in which the liquid on the surface generates adsorption force between the workpiece and a suction pad, and as a result, the workpiece cannot be detached from the suction pad at an accurate position.

In order to solve such a problem, the inventors have presumed as follows on the character of this adsorption force due to liquid.

Figure 9:
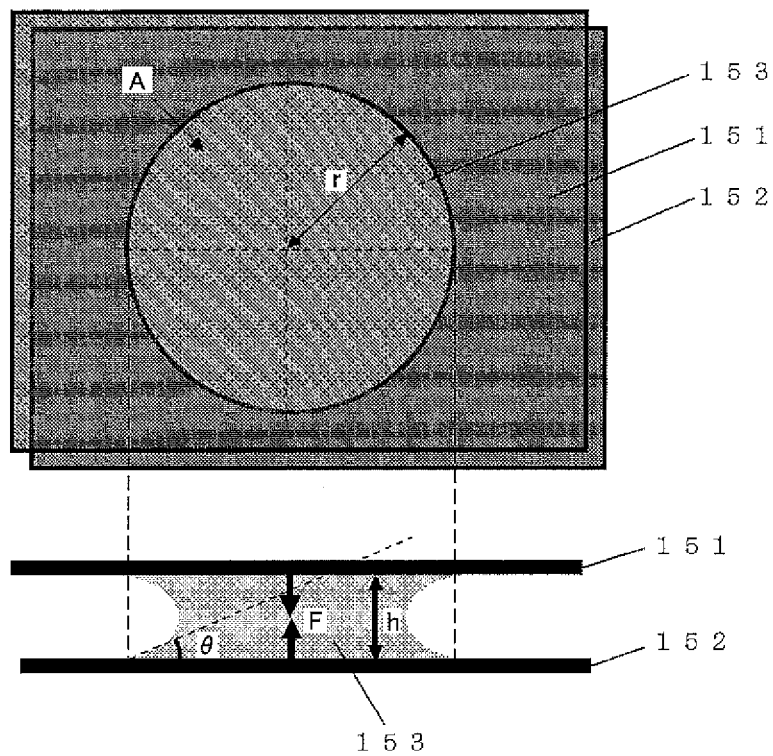
FIG. 9 is a figure to illustrate adsorption force F of the liquid intervening between objects.

It is known that the adsorption force F shown by the following equation is generated by liquid 153 intervening between two plates 151 and 152 being parallel with each other as shown in FIG. 9.

$$F = (\pi r^2 \times 2\gamma \cos\theta)/h = (2A\gamma \cos\theta)/h$$

wherein, "r" represents a radius of an intervening liquid cylinder, "A" represents an area of the intervening liquid, "γ" represents viscosity of the intervening liquid, "θ" represents a contact angle of a plane and the liquid, and "h" represents a height of the intervening liquid cylinder (the thickness of the liquid).

On the basis of this equation, the adsorption force due to liquid is proportional to an area of the intervening liquid, viscosity of the intervening liquid, and a cosine of a contact angle of the liquid on a plane, and is inversely proportional to the thickness of the intervening liquid.

Accordingly, for lowering the adsorption force due to liquid, it is favorable to make the area of the liquid "A", the viscosity of the liquid "γ", and the cosine of the contact angle "θ" of the liquid on a plain smaller; and to make the thickness of the intervening liquid "h" larger.

Herein, the viscosity of liquid and the liquid to be used are requirements on processing or results of processing, and accordingly it is desirable to avoid to change these parameters in view of transportation to aid the wafer processing. Therefore, the inventors have focused on the area and the thickness of the intervening liquid.

As a method to reduce the area, it is plausible to reduce the contact area with a workpiece itself by reconsidering the forms of the main body and the suction pad of the workpiece holding apparatus. In a region of a workpiece where is not in contact with a suction pad, however, the workpiece is bent with the own weight of the workpiece. Moreover, in this bent region where is not held by the suction pad, vibration can be occur when the workpiece is moved. Accordingly, when the contact area is simply reduced, the bending of the workpiece or the amplitude of the vibration get large, and it comes to be difficult to store the workpiece into a narrow spot such as a slot of a cassette or a box, or to set the workpiece into a particular spot in an apparatus.

In silicon wafers, the diameters are getting larger. Accordingly, if the contact area is reduced easily, it comes to be highly risky to generate the problems such as bending or vibration more noticeably when the diameters are more enlarged.

As a method for thickening the thickness of the intervening liquid, it is plausible to enlarge the contact angle between the liquid and a suction pad. As described above, the liquid itself is selected for the reason of processing in many cases, and is not desirable to be changed in view of transportation.

For enlarging the contact angle without changing the liquid, it is plausible to enhance the repellency of the suction pad. When the suction pad is new, the repellency is high, and can enlarge the contact angle thereby. However, in a polishing process of a silicon wafer, for example, it is usual to supply slurry which contains many wetting agent in the end of the polishing in order to protect the wafer surface after polishing. Such a wetting agent enhances the wettability with the operating time even in the suction pad with high repellency, and accordingly, it is difficult to maintain a large contact angle over the entire suction pad life.

Accordingly, the present inventors have conceived that, by swelling at least a part of an area of the suction pad to be in contact with the workpiece toward the workpiece in detaching a workpiece, it is possible to force to enlarge the distance between the workpiece and the suction pad (the thickness h of the intervening liquid), and it is possible to cause the liquid to move to reduce the area A; thereby brought the present invention to completion.

Hereinafter, the present invention will be described with referring to FIGS. 1 to 4.

Figure 1:
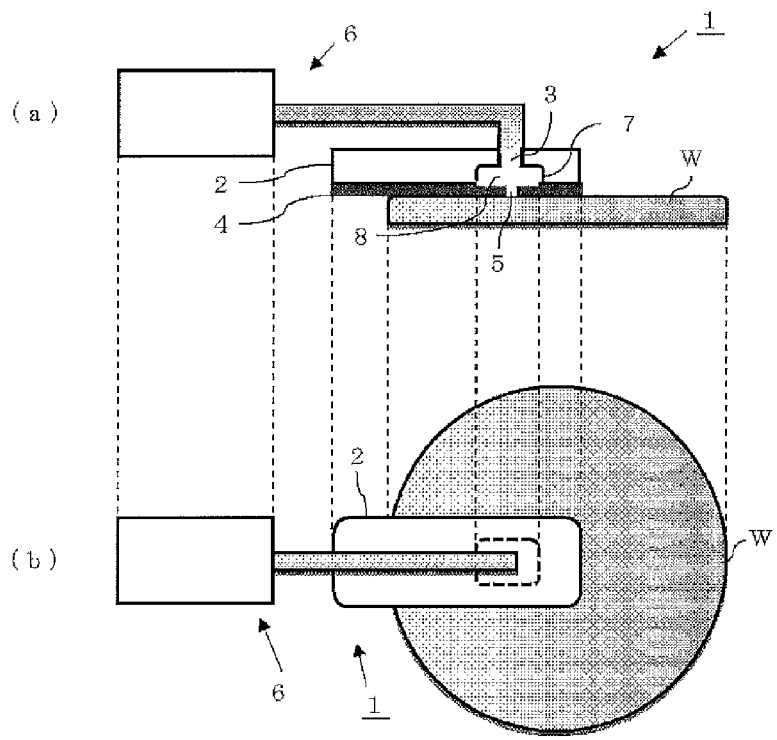
FIG. 1 (a) is a side sectional view to show an example of the workpiece holding apparatus of the present invention, and (b) is a top view to show an example of the workpiece holding apparatus of the present invention.

As shown FIG. 1, the inventive workpiece holding apparatus 1 comprises a rigid body 2, which is a main body of the apparatus, a suction pad 4 adhered onto the lower end face of the rigid body 2 and having elasticity, an air controlling mechanism 6, which can aspirate and discharge air, etc.

In the rigid body 2, a vent 3 is formed, and this vent 3 is communicating with the air controlling mechanism 6.

The suction pad 4 is provided with an opening 5 passing through the top surface to the under surface thereof. In case of FIG. 1, the opening 5 is connected to the vent 3 through a space 8. As described above, the opening 5 is allowed to aspirate and discharge air therefrom by aspirating and discharging air by the air controlling mechanism 6.

When such a workpiece holding apparatus 1 is attached to a robot or an actuator (not shown) and used for transporting a workpiece W, the suction pad 4 is brought into contact with the workpiece W while aspirating air by the air controlling mechanism 6 to hold the workpiece W by aspirating suction in holding the workpiece W.

Then, the workpiece holding apparatus 1, holding the workpiece W, is moved to an intended position by a robot or an actuator (not shown).

Subsequently, the workplace W is detached (separated) from the workpiece holding apparatus 1 to complete the transportation of the workpiece W to an intended position.

The present invention comprises a swelling portion being configured to swell out at least a part of an area of the suction pad 4 to be in contact with the workpiece W toward the workpiece W by being supplied with air by the air controlling mechanism 6 through the vent 3 when the workpiece W is detached in the foregoing transportation step.

For example, in the structure of the workpiece holding apparatus shown in FIGS. 1 (a) and (b), a concave part 7 formed on a lower end portion of the rigid body 2, the suction pad 4, and a space 8 defined by the both can be installed.

The suction pad 4 covering this space 8 is provided with an opening 5 to ensure a passage of air. This opening 5 is smaller than the space 8.

Figure 2:
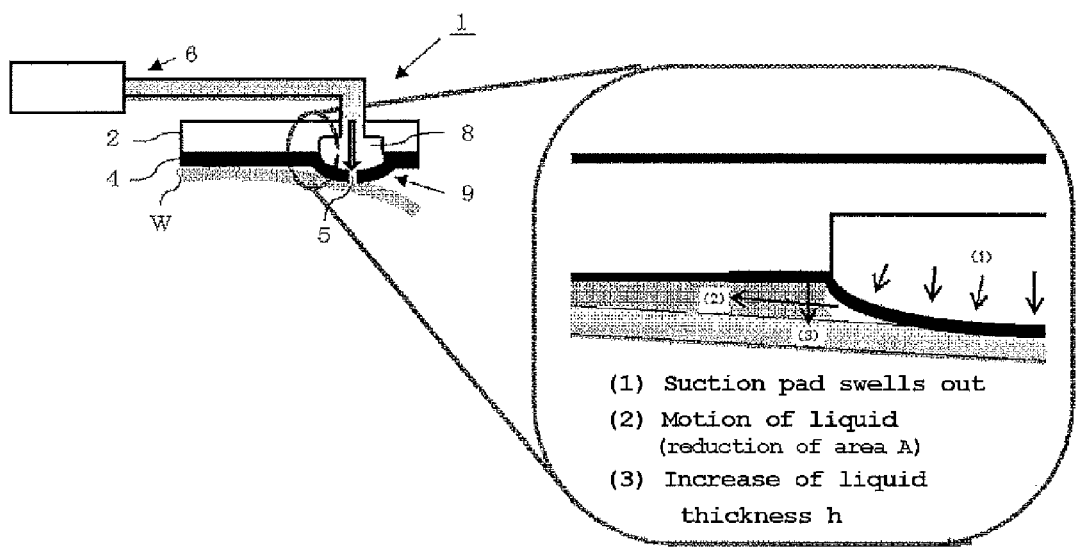
FIG. 2 is a schematic diagram to show an example of an embodiment when detaching a workpiece in the workpiece holding apparatus of the present invention.

In this structure, the opening 5 of the suction pad 4 is smaller than the space 8. Accordingly, as shown in FIG. 2, when air is discharged from the air controlling mechanism 6, the air pressure in the space 8 increases to swell out the vicinity of the opening 5 of the suction pad 4. As shown in FIG. 2, when the workpiece W is wetting, this swelling portion 9 forces to enlarge the distance between the workpiece W and the suction pad 4 ((1) in FIG. 2). As a result, liquid intervening between the workpiece W and the suction pad 4 moves to reduce the area A of the liquid ((2) in FIG. 2) and to increase the thickness h of the liquid ((3) in FIG. 2).

As described above, in such an inventive workpiece holding apparatus, even when detaching a workpiece having the surface with residual liquid, it is possible to largely reduce the adsorption force caused by the liquid to promote to detach the workpiece. Naturally, the present invention can be utilized to detach a dry workpiece having the surface without residual liquid. It is possible to promote to detach a workpiece more effectively compared to previous arts by pressing the workpiece downward by the swelling portion.

In transporting a workpiece, when the inventive workpiece holding apparatus is used with being attached to a robot or an actuator, it is possible to securely transport a workpiece to an intended position, and to prevent breakage of the wafer or the apparatus by unintended falling of the wafer. Accordingly, it is possible to prevent lowering of the yield and lowering of the productivity.

Figure 3:
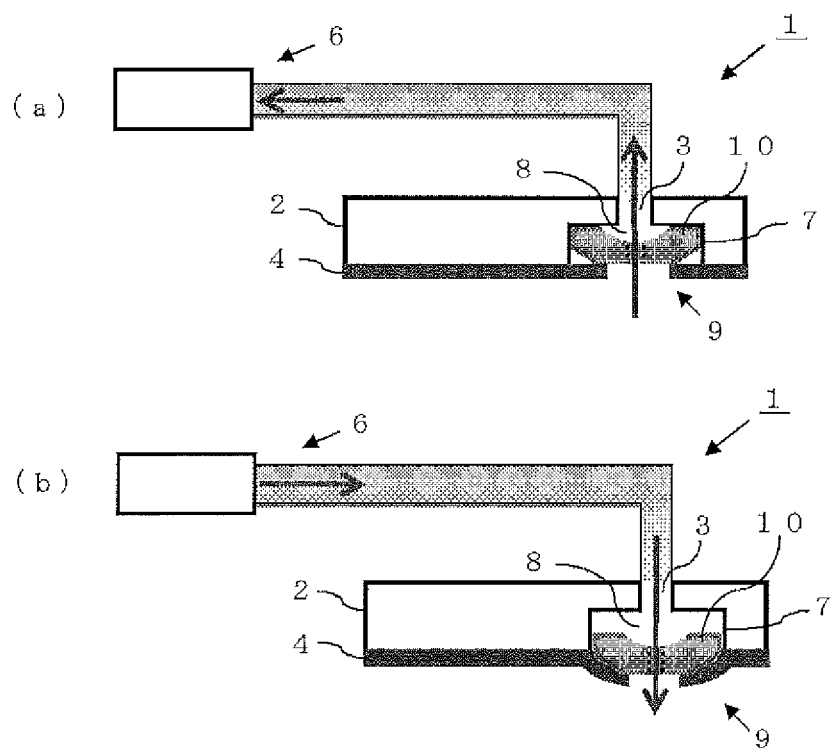
FIG. 3 (a) is a side sectional view to show an example of the inventive workpiece holding apparatus in suction of a workpiece when a pressurizing member is contained, and (b) is a side sectional view to show an example of the inventive workpiece holding apparatus in detaching of a workpiece when a pressurizing member is contained.

As shown in FIG. 3, the swelling portion 9 is preferably provided with a pressurizing member 10 in the space 8, in which the pressurizing member 10 is configured to be pressurized by air discharged from the air controlling mechanism 6 to pressurize the suction pad 4 to swell out the suction pad 4.

This pressurizing member 10 can have a thickness which is the same as the depth of the concave part 7 of the rigid body 2, for example, and can be provided with a hole smaller than the vent 3 to passage air through the central part. By such a structure, although the surface structure of the suction pad 4 is not changed in suction of a workpiece ((a) in FIG. 3), it is possible to pressurize this pressurizing member 10 with air and to pressurize the suction pad 4 in detaching, and to swell out the suction pad 4 ((b) in FIG. 3).

As described above, in a swelling portion having a pressurizing member in the space thereof, the suction pad can be swelled out more securely by the pressurizing member, and accordingly a workpiece can be detached from the suction pad more securely.

The foregoing FIG. 1, FIG. 2, and FIG. 3 shows an example in which the suction pad 4 is provided with the swelling portion 9 at the opening 5, however, the swelling portion 9 can be separately installed to a position other than the opening 5. That is, the swelling portion can be located at a position other than the opening 5 in the area of the suction pad 4 to be in contact with the workpiece W.

Figure 4:
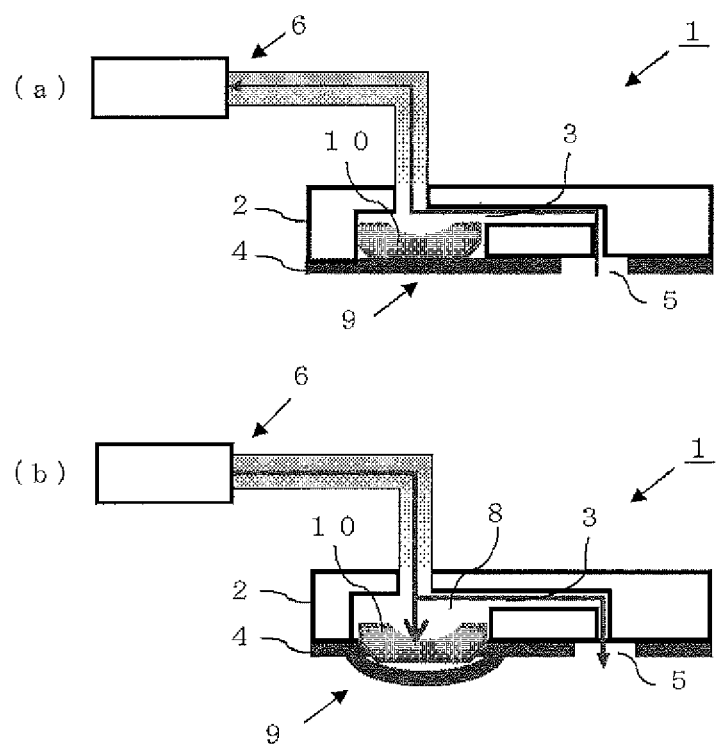
FIG. 4 (a) is a side sectional view to show an example of the inventive workpiece holding apparatus in suction of a workpiece when a swelling portion and an opening are in different positions, and (b) is a side sectional view to show an example of the inventive workpiece holding apparatus in detaching of a workpiece when a swelling portion and an opening are in different positions.

For example, as shown in FIG. 4 (a), a vent 3 in a rigid body 2 is set to communicate with each of an opening 5 and a swelling portion 9, and the swelling portion 9 is separately located in a position of a suction pad 4 other than the opening 5.

In such an apparatus, as shown in FIG. 4 (b), the surface of the swelling pad 4 swells out at a different position from the opening 5 by air discharged by the air controlling mechanism 6 when detaching a workpiece.

In this case, a pressurizing member 10 can also be contained in a space 8 as shown in FIG. 4.

The reducing amount of adsorption force, which is due to liquid intervening between a workpiece and a suction pad, is larger as the swelling amount of the swelling portion is larger. The swelling amount can be controlled by changing the pressure for supplying air in swelling the swelling portion, the area of the swelling portion, and the material and the thickness of the suction pad. It is possible to obtain a desired swelling amount by optimizing the combination of these parameters in accordance with an environment in which the apparatus is used. It is also possible to optimize the detaching of a workpiece by appropriately setting the position to form the swelling portion in accordance with the form of a workpiece to be held.

EXAMPLE

Hereinafter, the present invention will be more specifically described with referring to Example and Comparative Example, but the present invention is not limited to thereto.

Example 1

Figure 5:
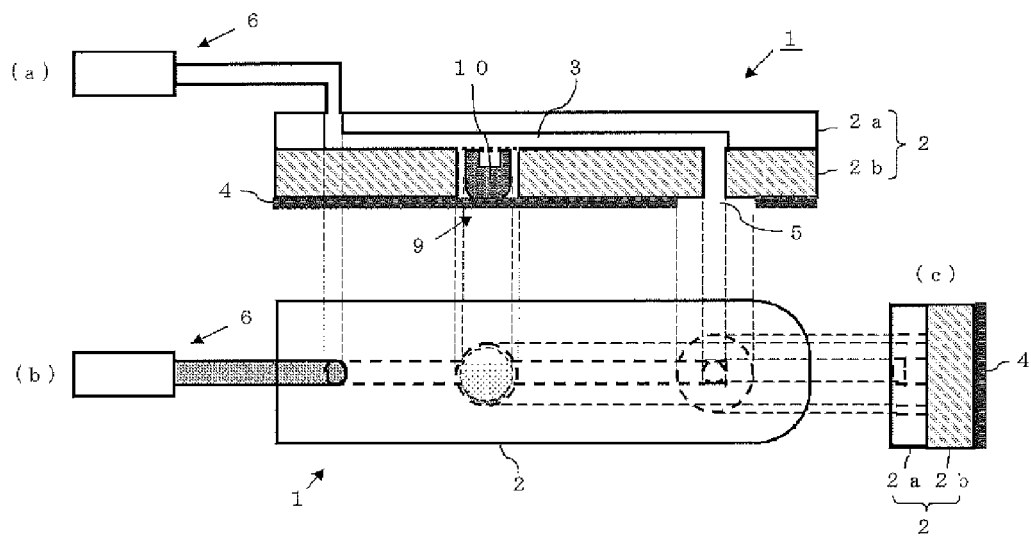
FIG. 5 (a), (b), and (c) respectively illustrate a side sectional view, a top view, and a front view of the workpiece holding apparatus produced in Example 1.

First, an inventive workpiece holding apparatus was produced in an embodiment in which the swelling portion 9 is located at a position other than the opening 5 in the area of the suction pad 4 to be in contact with the workpiece W as shown in FIGS. 5 (a), (b), and (c).

The workpiece holding apparatus was produced as follows.

As a rigid body 2, being a main body of the workpiece holding apparatus 1, a superposition structure of a PVC board 2a (polyvinyl chloride board) with a thickness of 3 mm and a stainless board 2b with a thickness of 5 mm was adopted as shown in FIG. 5. Onto the superimposed face between the PVC board 2a and the stainless board 2b, a groove with a width of 6 mm and a depth of 1.5 mm was made to form a part of a vent 3, which is a passage of air. The rigid body 2 was provided with a hole with a diameter of 6 mm on the side of the stainless board 2b as a part of the vent 3 in order to suck a workpiece. For a swelling portion 9 of the suction pad, the stainless board 2b was hollowed to form a hole with a diameter of 15 mm, and to this hole, a pressurizing member 10 with the same depth as that of the hole and having a diameter smaller than that of the hole by 0.1 mm was installed. As for the pressurizing member 10, the same material as that of the suction pad 4 was used.

Onto the lower end face of the rigid body 2, a backing pad with a thickness of 0.5 mm (manufactured by Nitta Haas Incorporated, R601) was adhered as the suction pad 4 through double-side adhesive tape. Onto the suction pad 4, an opening 5 with an area of 160 mm$^2$ was formed in order to ensure sufficient suction force. To the vent 3, a tube of an air controlling mechanism 6 was connected from the side of the PVC board 2a. As described above, the workpiece holding apparatus 1 was produced.

Figure 6:
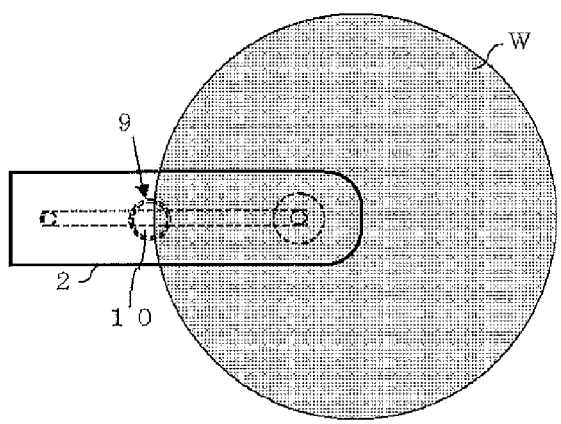
FIG. 6 is a top view to show a case in Example 1, wherein a wafer is held by the inventive workpiece holding apparatus.

Then, a wafer W with a diameter of 300 mm was held by the workpiece holding apparatus 1. In this case, the area in which the workpiece holding apparatus 1 was in contact with the wafer W in holding the wafer W was set to 4050 mm$^2$. As shown in FIG. 6, the swelling portion 9 was located so as to overlap with the periphery of the wafer W.

The adsorption pressure in suction of the wafer was set to 0.1 MPa. This is because the workpiece holding apparatus 1 was used in the facility with the vacuum pressure of 0.1 MPa, and the size to hollow the pad which can stably suck the wafer by this pressure was 160 mm$^2$.

Figure 7:
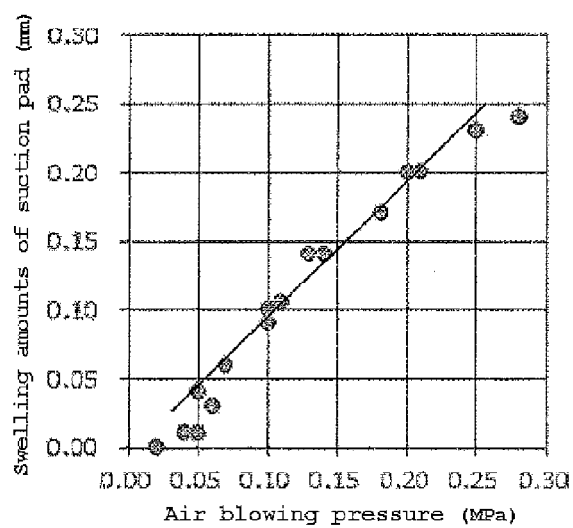
FIG. 7 is a graph to show a relation between air blowing pressure and swelling amounts of the suction pad measured in Example 1.

The air blowing pressure was set to 0.1 MPa when detaching a wafer. In this case, the swelling amounts of the swelling portion of the suction pad were measured when the air blowing pressure was changed. The results were shown in FIG. 7.

In this case, the swelling amounts varied largely when the air blowing pressure was low, but the swelling amount was stably increased after the pressure was over 0.1 MPa. Accordingly, the air blowing pressure was set to 0.1 MPa, which can gives sufficient lowering ability of adsorption force and the swelling amount of the suction pad came to be more stabilized, in this case. For lowering the adsorption force, it is advantageous to increase the air blowing pressure and to enlarge the deformation amount of the pad. The air blowing pressure about 0.1 MPa, however, does not involve a risk to stretch the pad itself by too large pressure nor a risk to peel the suction pad from the vicinity of the swelling portion. Although the air blowing pressure was set to 0.1 MPa in this case, the adsorption force can be lowered at 0.1 MPa or less as a matter of course.

The workpiece holding apparatus thus produced was adopted as an automatic handling apparatus attached to a polisher. The occurrence of an error relating to transportation or storage of a wafer, being caused by adsorption force due to liquid intervening between the suction pad and the wafer, turned zero in a month.

Furthermore, the following experiment was performed in order to verify that in aspirating suction of a wetted wafer by a suction pad, the adsorption force due to liquid intervening between the suction pad and the wafer can be lowered by deforming a part of the suction pad when the wafer is detached.

Figure 8:
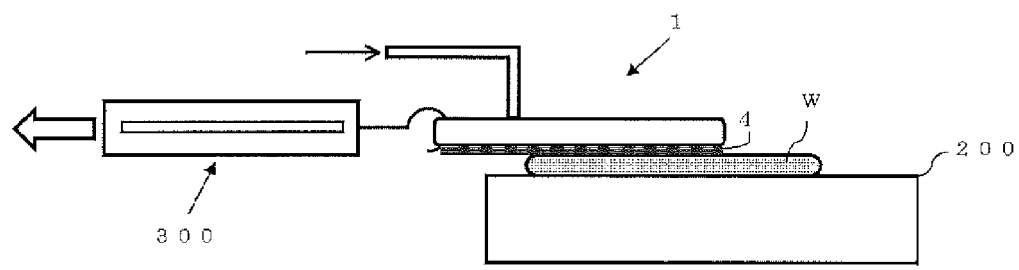
FIG. 8 is a figure to illustrate an outline of the experiment performed in Example 1.

As shown in FIG. 8, a wafer with a diameter of 300 mm was adhered and fixed onto a table 200. Then, the surface of the wafer W fixed on the table 200 was wetted with water sufficiently. Subsequently, the surface of the wafer W was pressed down with the inventive workpiece holding apparatus 1, and the wafer was adhered to the workpiece holding apparatus 1 by the water wetting on the surface. In this case, the adsorption force was solely due to the water intervening the suction pad 4 and the wafer W, since vacuum was not utilized. Then, a spring scale 300 was mounted onto the workpiece holding apparatus 1 adhering the wafer, and the workpiece holding apparatus 1 was pulled in a horizontal direction while supplying air with a blowing pressure of 0.05 MPa. Then, the adsorption force due to the intervening liquid was measured on the basis of a value indicated by the spring scale when the workpiece holding apparatus 1 adhered to the wafer W started to move on the wafer. This experiment was repeated, and the average value of the values indicated by the spring scale was calculated to be 5.6 g. This value is notably small compared to that of Comparative Example described later, which have verified that the present invention can largely lower the adsorption force between a wafer and a suction pad when a workpiece holding apparatus detaches the wafer.

Comparative Example 1

Figure 10:
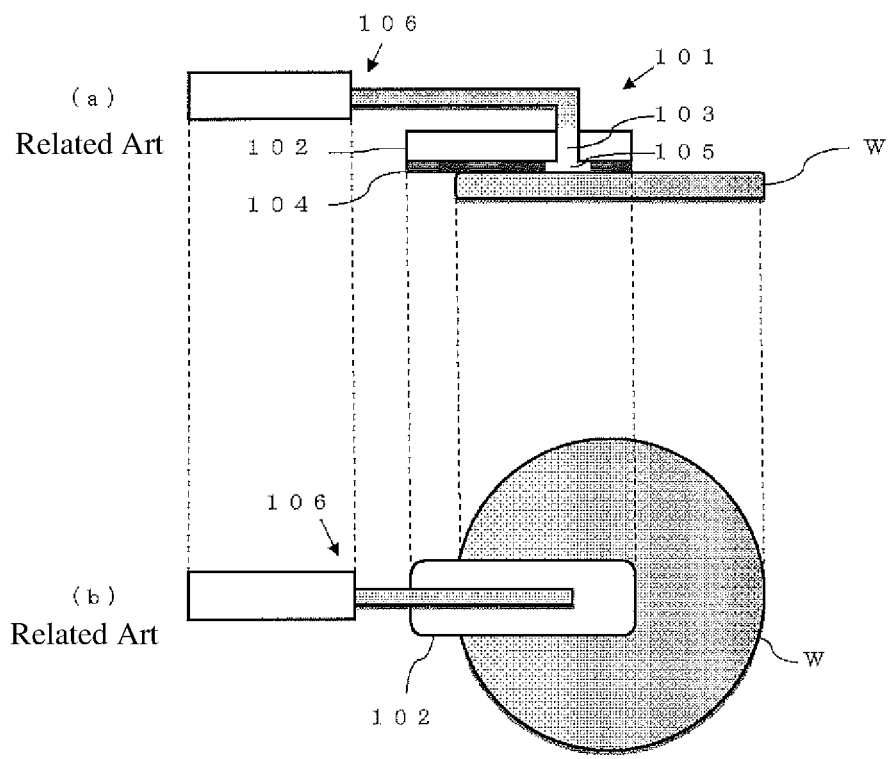
FIG. 10 (a) is a side sectional view to show an example of the conventional workpiece holding apparatus, and (b) is a top view to show an example of the conventional workpiece holding apparatus.

An experiment and holding of a wafer with a diameter of 300 mm were performed in the same conditions as in Example 1, except for using a previous workpiece holding apparatus as shown in FIG. 10, that is, using a workpiece holding apparatus without a swelling portion of the present invention.

The previous workplace holding apparatus was adopted as an automatic handling apparatus attached to a polisher as in Example 1. This resulted 13 errors in a month relating to transportation or storage of a wafer, which is caused by adsorption force due to liquid intervening between the suction pad and the wafer.

In aspirating suction of a wafer wetted with water by a suction pad with previous workpiece holding apparatus, adsorption force due to liquid intervening between the suction pad and the wafer was measured when the wafer was detached as the experiment in Example 1 shown in FIG. 8.

As the result, the average value of values indicated by the spring scale was calculated to be 61 g, which revealed that the adsorption force was more than ten times compared to that of Example 1.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A workpiece holding apparatus, comprising:
a rigid body having a vent;
a suction pad adhered onto a lower end face of the rigid body and having an opening communicating with the vent, being configured to suck and hold a workpiece;
an air controlling mechanism communicating with the vent, being configured to aspirate or discharge air through the vent to aspirate or discharge air from the opening; and
a swelling portion being configured to be supplied with air by the air controlling mechanism through the vent to swell out at least a part of an area of the suction pad to be in contact with the workpiece toward the workpiece in detaching the workpiece from the suction pad; wherein
the suction pad is configured to suck and hold the workpiece by bringing the opening into contact with the workpiece while aspirating air by the air controlling mechanism to aspirate air through the opening, and is configured to detach the workpiece from the suction pad by discharging air from the air controlling mechanism to discharge air through the opening,
the swelling portion is composed of a concave part formed on a lower end portion of the rigid body, the suction pad, and a space defined by the concave part and the suction pad; and the space is configured to be supplied with air and pressurized by the air controlling mechanism to swell out the suction pad toward the workpiece, and,
the swelling portion is provided with a pressurizing member in the space thereof, the pressurizing member being configured to be pressurized by air discharged from the air controlling mechanism to pressurize the suction pad to swell out the suction pad.

2. The workpiece holding apparatus according to claim 1, wherein the swelling portion is located at a position other than the opening in the area of the suction pad to be in contact with the workpiece.

* * * * *